(12) United States Patent
Nakagawa et al.

(10) Patent No.: US 11,329,474 B2
(45) Date of Patent: May 10, 2022

(54) SWITCHING CONTROLLER WITH ADAPTIVE OVERHEATING PROTECTION

(71) Applicant: Fuji Electric Co., Ltd., Kanagawa (JP)

(72) Inventors: Sho Nakagawa, Nagano (JP); Morio Iwamizu, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/864,438

(22) Filed: May 1, 2020

(65) Prior Publication Data

US 2020/0403397 A1 Dec. 24, 2020

(30) Foreign Application Priority Data

Jun. 18, 2019 (JP) .............................. JP2019-112866

(51) Int. Cl.
*H02H 3/087* (2006.01)
*H02H 5/04* (2006.01)
(Continued)

(52) U.S. Cl.
CPC ............... *H02H 3/087* (2013.01); *G01K 7/01* (2013.01); *G01R 19/16528* (2013.01);
(Continued)

(58) Field of Classification Search
CPC .......... H02H 3/087; H02H 5/04; H02H 5/041; G05F 1/573; H03K 17/0812;
(Continued)

(56) References Cited

U.S. PATENT DOCUMENTS

2008/0278868 A1* 11/2008 Morino ................... G05F 1/573
361/18
2010/0046123 A1* 2/2010 Fukami .............. H03K 17/0822
361/18
(Continued)

FOREIGN PATENT DOCUMENTS

JP 2014-158326 A 8/2014

OTHER PUBLICATIONS

Morisawa et al., "High-Side 2-in-1 IPS "F5114H" for Automobiles", Fuji Electric Review, 2016, vol. 62, No. 4, p. 261-264.

*Primary Examiner* — Danny Nguyen
(74) *Attorney, Agent, or Firm* — Chen Yoshimura LLP (57) ABSTRACT

A semiconductor device includes a power semiconductor switch; a logic circuit connected to an input terminal; an overheat detection circuit that outputs to the logic circuit an overheat detection signal when a temperature of the power semiconductor switch exceeds an overheat detection threshold; and an overcurrent detection circuit that monitors a current that flows through the power semiconductor switch and that outputs to the logic circuit and to the overheat detection circuit an overcurrent detection signal when the current that flows through the power semiconductor switch exceeds a prescribed threshold, wherein in the overheat detection circuit, the overheat detection threshold values is changed from a first threshold value to a second threshold value that is lower than the first threshold value when the overheat detection circuit receives the overcurrent detection signal from the overcurrent detection circuit.

14 Claims, 7 Drawing Sheets

(51) Int. Cl.
*G05F 1/573* (2006.01)
*H03K 17/0812* (2006.01)
*H01L 29/866* (2006.01)
*G01K 7/01* (2006.01)
*H03K 3/037* (2006.01)
*H03K 19/003* (2006.01)
*G01R 19/165* (2006.01)
*H03K 17/08* (2006.01)

(52) U.S. Cl.
CPC ............ *G05F 1/573* (2013.01); *H01L 29/866* (2013.01); *H02H 5/041* (2013.01); *H03K 3/0377* (2013.01); *H03K 17/08122* (2013.01); *H03K 19/00315* (2013.01); *H03K 2017/0806* (2013.01)

(58) Field of Classification Search
CPC ..... H03K 17/08122; H03K 2017/0806; H03K 3/0377; H03K 19/00315; G01R 19/165; G01R 19/16528; H01L 29/866; G01K 7/01
USPC .......................... 361/103, 86–87, 93.7–93.9
See application file for complete search history.

(56) References Cited

U.S. PATENT DOCUMENTS

| | | | |
|---|---|---|---|
| 2011/0058297 A1* | 3/2011 | Higashida | H03K 17/0822 361/93.9 |
| 2015/0155700 A1* | 6/2015 | Alvarez Valenzuela | H03K 17/0822 361/93.9 |
| 2019/0204889 A1* | 7/2019 | Kaeriyama | G06F 1/28 |

* cited by examiner

Logic Table of Logic Circuit

| Mode | Logic Input Signal | Logic Output Signal |
|---|---|---|
| Normal | L<br>H | L<br>H |
| Overheat detection | L<br>H | L<br>L |
| Overcurrent detection | L<br>H | L<br>Chopping Operation |
| Overvoltage detection | L<br>H | L<br>L |

FIG. 7

SWITCHING CONTROLLER WITH ADAPTIVE OVERHEATING PROTECTION

BACKGROUND OF THE INVENTION

Technical Field

The present invention relates to a semiconductor device, and more particularly, to a semiconductor device performing stitching control, on a high voltage side of a power supply, of a load that is arranged on a ground side of the power supply.

Background Art

Automobiles typically are equipped with many semiconductor devices that perform switching control of loads, such as a motor. As such semiconductor devices to be mounted in automobiles, a high-side IPS (intelligent Power Switch) is often used. The high-side IPS integrates a power semiconductor switch arranged on the high-voltage side of the load to supply power to the load, and a control circuit therefor. Typically, an N-channel MOSFET (Metal-Oxide-Semiconductor Filed-Effect Transistor) having a small ON resistance per unit area is used as the power semiconductor switch of the high-side IPS.

Figure 6:
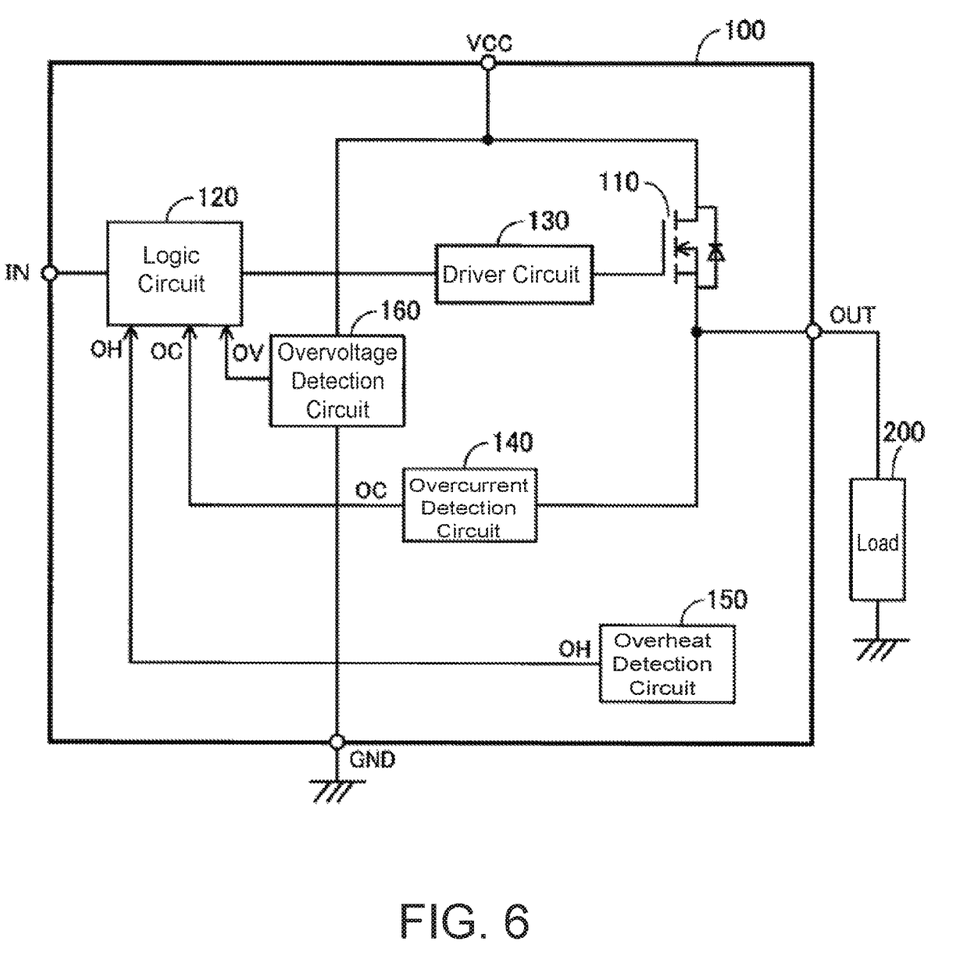
FIG. 6 shows a configuration of a conventional high-side IPS.
Figure 7:
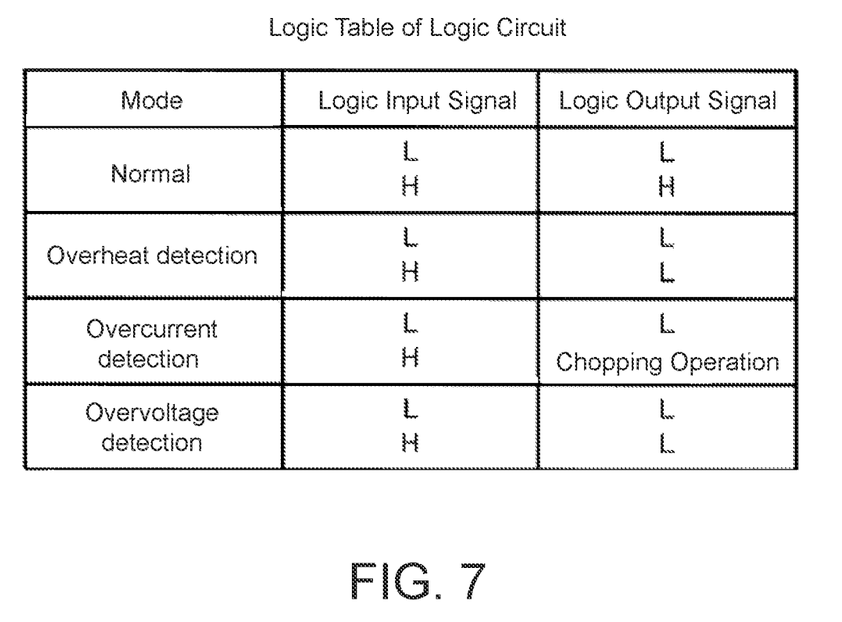
FIG. 7 is a logic table of a logic circuit in the conventional high-side IPS.

FIG. 6 shows a configuration example of a conventional high-side IPS. FIG. 7 is a logic table of a logic circuit of the logic circuit of the high-side IPS. In explaining FIG. 6, the name of a terminal and the voltage or signal that is associated with the terminal may be referred to by the same reference numerals/characters.

As shown FIG. 6, the conventional high-side IPS 100 includes a main MOSFET 110, a logic circuit 120, and a driver circuit 130. The high-side IPS 100 further includes, as protection circuits, an overcurrent detection circuit 140, an overheat detection circuit 150, and an overvoltage detection circuit 160, and has an IN terminal, a VCC terminal, an OUT terminal, and a GND terminal.

The IN terminal of the high-side IPS 100 is connected to an input terminal of the logic circuit 120, an output terminal of the logic circuit 120 is connected to an input terminal of the driver circuit 130, and an output terminal of the driver circuit 130 is connected to a gate terminal of the main MOSFET 110. A drain terminal of the main MOSFET 110 is connected to the VCC terminal, and the VCC terminal in turn is connected to a battery of an automobile to provide the voltage VCC. A source terminal of the main MOSFET 110 is connected to the OUT terminal and the OUT terminal is connected to the load 200.

The OUT terminal is also connected to the overcurrent detection circuit 140, and an output terminal of the overcurrent detection circuit 140 is connected to a terminal of the logic circuit 120 that receives an overcurrent detection signal OC. An output terminal of the overheat detection circuit 150 is connected to a terminal of the logic circuit 120 that receives an overheat detection signal OH. The overvoltage detection circuit 160 is connected to the VCC terminal and the GND terminal, and an output terminal of the overvoltage detection circuit 160 is connected to a terminal of the logic circuit 120 that receives an overvoltage detection signal OV.

When the high-side IPS 100 is operating normally, as shown in FIG. 7, when the IN terminal is inputted with the low-level ("L-level") logic input signal, the logic circuit 120 generates and outputs the L-level logic output signal. This logic output signal is supplied to the gate terminal of the main MOSFET 110 via the driver circuit 130 to control the main MOSFET 110 to be OFF, thereby not supplying the voltage VCC to the load 200.

When the high-level ("H-level") logic input signal is inputted to the IN terminal, the logic circuit 120 generates and outputs the H-level logic output signal. This logic output signal is supplied to the gate terminal of the main MOSFET 110 via the driver circuit 130 to control the main MOSFET to be ON, thereby supplying the voltage VCC to the load 200.

When the overcurrent detection circuit 140 is detecting an overcurrent at the main MOSFET 110, if the L-level logic input signal is inputted to the IN terminal, the logic circuit 120 generates and outputs the L-level logic output signal to control the main MOSFET 110 to be OFF.

When the overcurrent detection circuit 140 is detecting an overcurrent at the main MOSFET 110, if the H-level logic input signal is inputted to the IN terminal, the logic circuit 120 outputs a chopping operation signal. This chopping operation signal is a periodic High and Low signal train having a prescribed duty cycle. Due to the chopping signal, the main MOSFET is not maintained to be in the OFF state, but is controlled to be turned ON intermittently and periodically. Because of this, if the overcurrent situation is resolved to the normal situation during the chopping operation, the logic circuit 120 returns to the normal operation mode.

When the overheat detection circuit 150 is detecting an overheat of the main MOSFET, if the L-level logic input signal is inputted to the IN terminal, the logic circuit 120 generates and outputs the L-level logic output signal, thereby controlling the main MOSFET 110 to be OFF.

When the overheat detection circuit 150 is detecting an overheat of the main MOSFET, if the H-level logic input signal is inputted to the IN terminal, the logic circuit 120 still generates and outputs the L-level logic output signal, thereby controlling the main MOSFET 110 to be OFF.

When the overvoltage detection circuit 160 is detecting an abnormally high voltage, if the L-level logic input signal is inputted to the IN terminal, the logic circuit 120 generates and outputs the L-level logic output signal, thereby controlling the main MOSFET 110 to be OFF.

When the overvoltage detection circuit 160 is detecting an abnormally high voltage, if the H-level logic input signal is inputted to the IN terminal, the logic circuit 120 still generates and outputs the L-level logic output signal, thereby controlling the main MOSFET 110 to be OFF.

As described above, when the overcurrent detection circuit 140 is detecting an overcurrent due to, for example, a short-circuit at the load, if the H-level logic input signal is inputted to the IN terminal, the load 200 is intermittently provided with current due to the chopping operation, thereby reducing stress applied to the main MOSFET 110. However, this overcurrent situation may not be resolved (and the normal condition thereby resumed) in a short period of time. If the chopping operation continues for a long period of time, the temperature of the main MOSFET 110 will continue to rise until the overheat detection circuit 150 detects an overheat. When the temperature rises due to the overcurrent, the main MOSFET 110 is under greater stress than when the temperature rises due to a rise of the ambient temperature. Thus, the overcurrent situation causes greater damages to the main MOSFET 110.

To solve this issue, in the conventional art, a threshold that is used in determining the overcurrent is changed based on the duration in which the overcurrent situation continues. See Patent Document 1, for example. In the technology described in Patent Document 1, the longer the period of the overcurrent situation, the progressively lower the threshold for the overcurrent is changed to, thereby protecting the main power semiconductor switch from the overcurrent situation.

RELATED ART DOCUMENT

Patent Document

Patent Document 1: Japanese Patent Application Laid-Open Publication No. 2014-158326

SUMMARY OF THE INVENTION

In the conventional semiconductor device, however, when the overcurrent situation, the overheating situation, and a high-voltage situation (a situation with a high voltage, but not as high as the abnormally high voltage (overvoltage)) respectively continue for only a short period of time, stress to the power semiconductor switch is small, but when the overheat situation occurs due to the overcurrent or the high voltage situation, the power semiconductor switch is subject to greater stress.

Accordingly, the present invention is directed to a semiconductor device that substantially obviates one or more of the problems due to limitations and disadvantages of the related art. An object of the present invention is to provide a semiconductor device in which a power semiconductor switch does not suffer great damage, such as burnout, even if the overheat situation occurs due to the overcurrent or high voltage situation.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device having an input terminal to receive an input signal, an output terminal to be connected to a load, and a power supply terminal to receive a power supply voltage, the semiconductor device comprising: a power semiconductor switch connected between the power supply terminal and the output terminal; a logic circuit connected to the input terminal, the logic circuit generating a logic output signal in accordance with the input signal inputted to the input terminal, the logic output signal causing the power semiconductor switch to turn ON or OFF; an overheat detection circuit that outputs to the logic circuit an overheat detection signal when a temperature of the power semiconductor switch exceeds an overheat detection threshold; and an overcurrent detection circuit that monitors a current that flows through the power semiconductor switch and that outputs to the logic circuit and to the overheat detection circuit an overcurrent detection signal when the current that flows through the power semiconductor switch exceeds a prescribed threshold, wherein in the overheat detection circuit, the overheat detection threshold is set to a first threshold value when semiconductor device is operating normally, and the overheat detection threshold values is changed to a second threshold value that is lower than the first threshold value when the overheat detection circuit receives the overcurrent detection signal from the overcurrent detection circuit.

In another aspect, the present disclosure provides a semiconductor device having an input terminal to receive an input signal, an output terminal to be connected to a load, and a power supply terminal to receive a power supply voltage, the semiconductor device comprising: a power semiconductor switch connected between the power supply terminal and the output terminal; a logic circuit connected to the input terminal, the logic circuit generating a logic output signal in accordance with the input signal inputted to the input terminal, the logic output signal causing the power semiconductor switch to turn ON or OFF; an overheat detection circuit that outputs to the logic circuit an overheat detection signal when a temperature of the power semiconductor switch exceeds an overheat detection threshold; and a high-voltage detection circuit that monitors the power supply voltage on the power supply terminal and outputs to the overheat detection circuit a high-voltage detection signal when the power supply voltage exceeds a prescribed voltage, wherein in the overheat detection circuit, the overheat detection threshold is set to a first threshold value when semiconductor device is operating normally, and the overheat detection threshold values is changed to a second threshold value that is lower than the first threshold value when the overheat detection circuit receives the high-voltage detection signal from the high-voltage detection circuit.

In at least some of the aspects of the semiconductor devices described above, when an overheat condition occurs as a result of an overcurrent or a higher voltage of the power supply, the overheat detection circuit determines that the overheat occurs at a temperature lower than a temperature at which the overheat would be determined to occur under the normal situation (i.e., situation where no overcurrent or higher voltage situation occurs). This protects the power semiconductor switch from damages significantly.

It is to be understood that both the foregoing general description and the following detailed description are exemplary and explanatory, and are intended to provide further explanation of the invention as claimed.

DETAILED DESCRIPTION OF EMBODIMENTS

Embodiments of the present invention will be described below where the present invention is applied to a high-side IPS. Throughout the appended drawings, the same constituent element is referenced by the same reference character/numeral. Further, the name of a terminal and voltage or signal applied to that terminal may be referred to by the same reference numeral/character, as the case may be.

Figure 1:
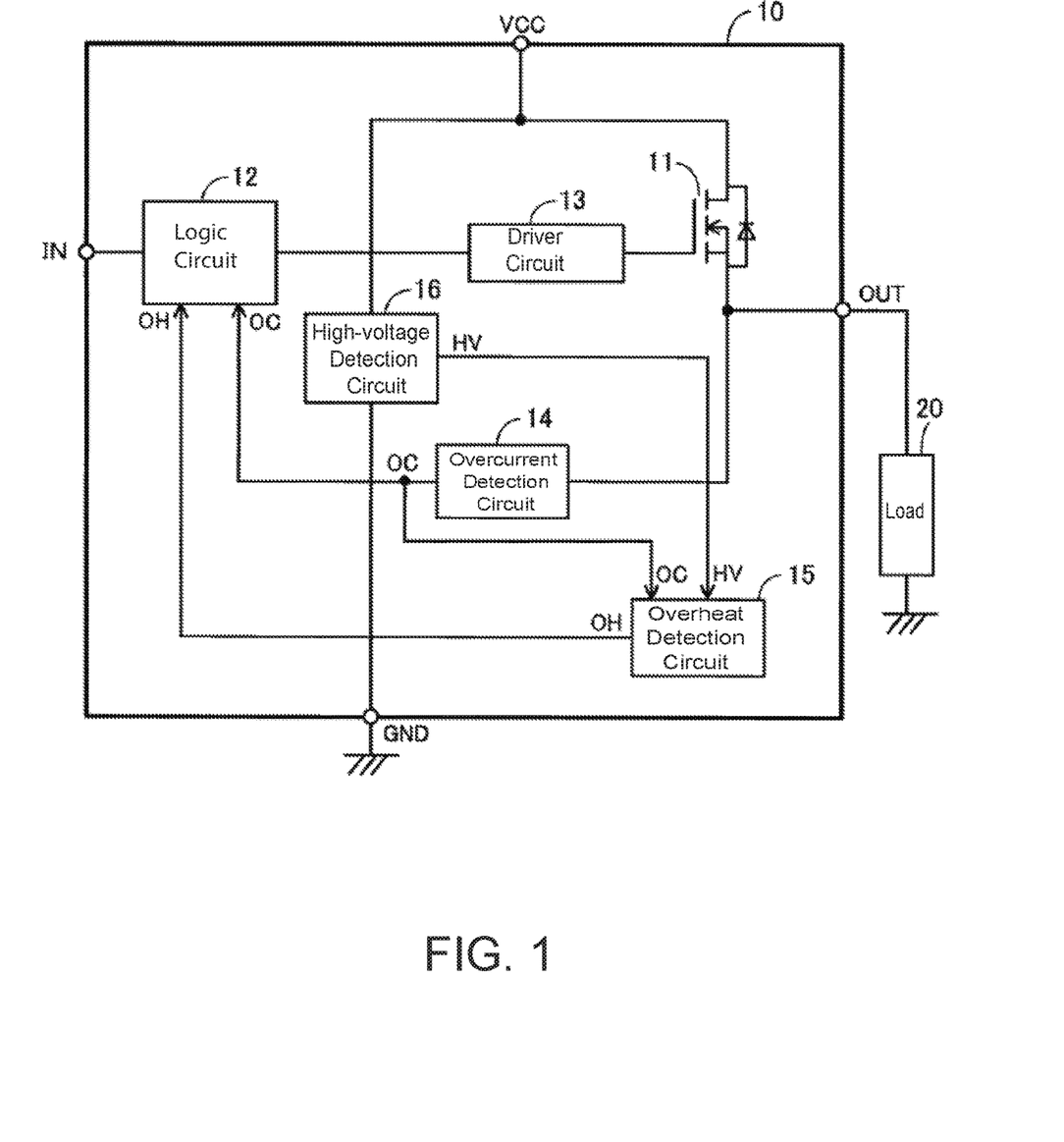
FIG. 1 shows a configuration of a high-side IPS according to an embodiment of the present invention.
Figure 2:
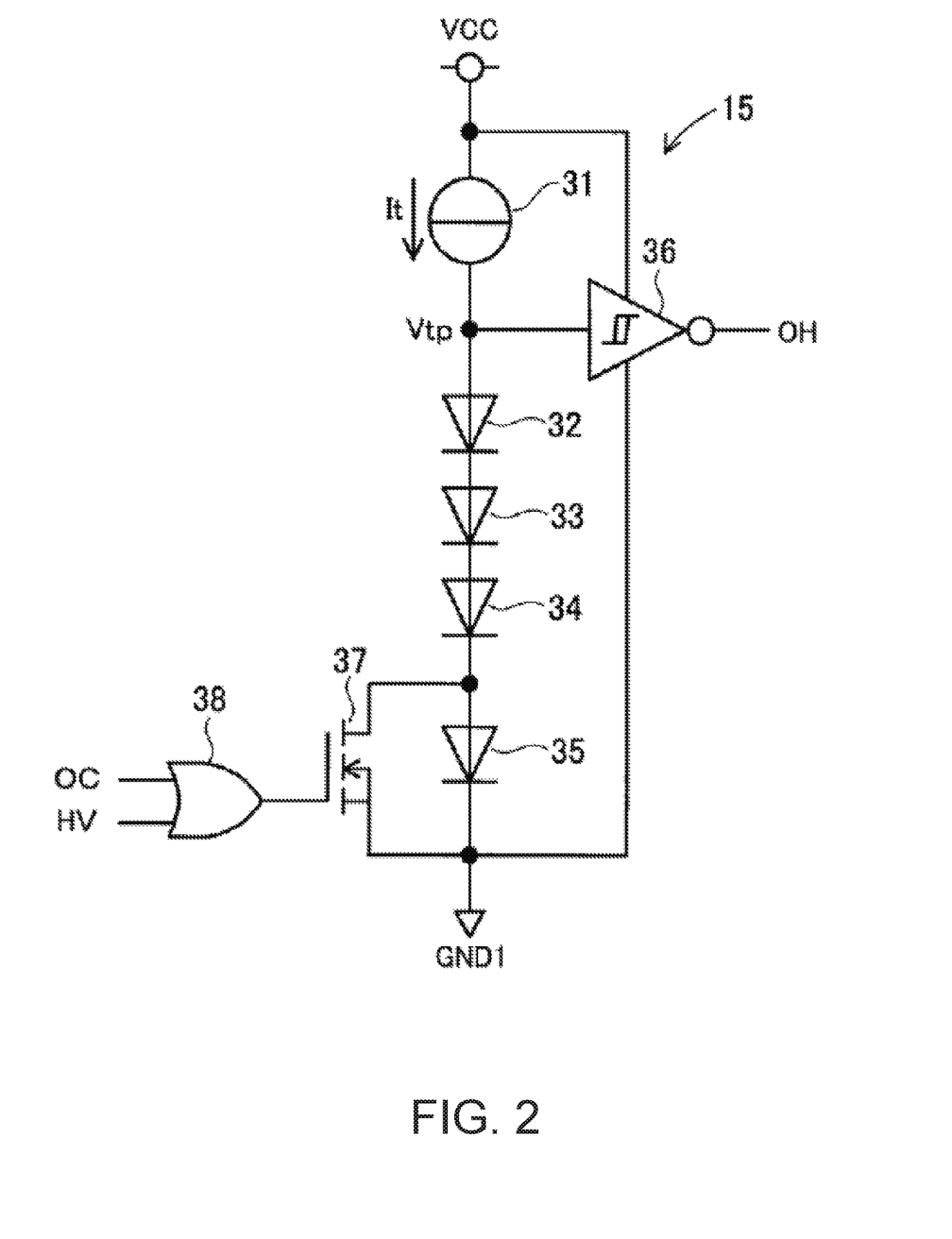
FIG. 2 is a circuit diagram of an example of an overheat detection circuit of the embodiment.
Figure 3:
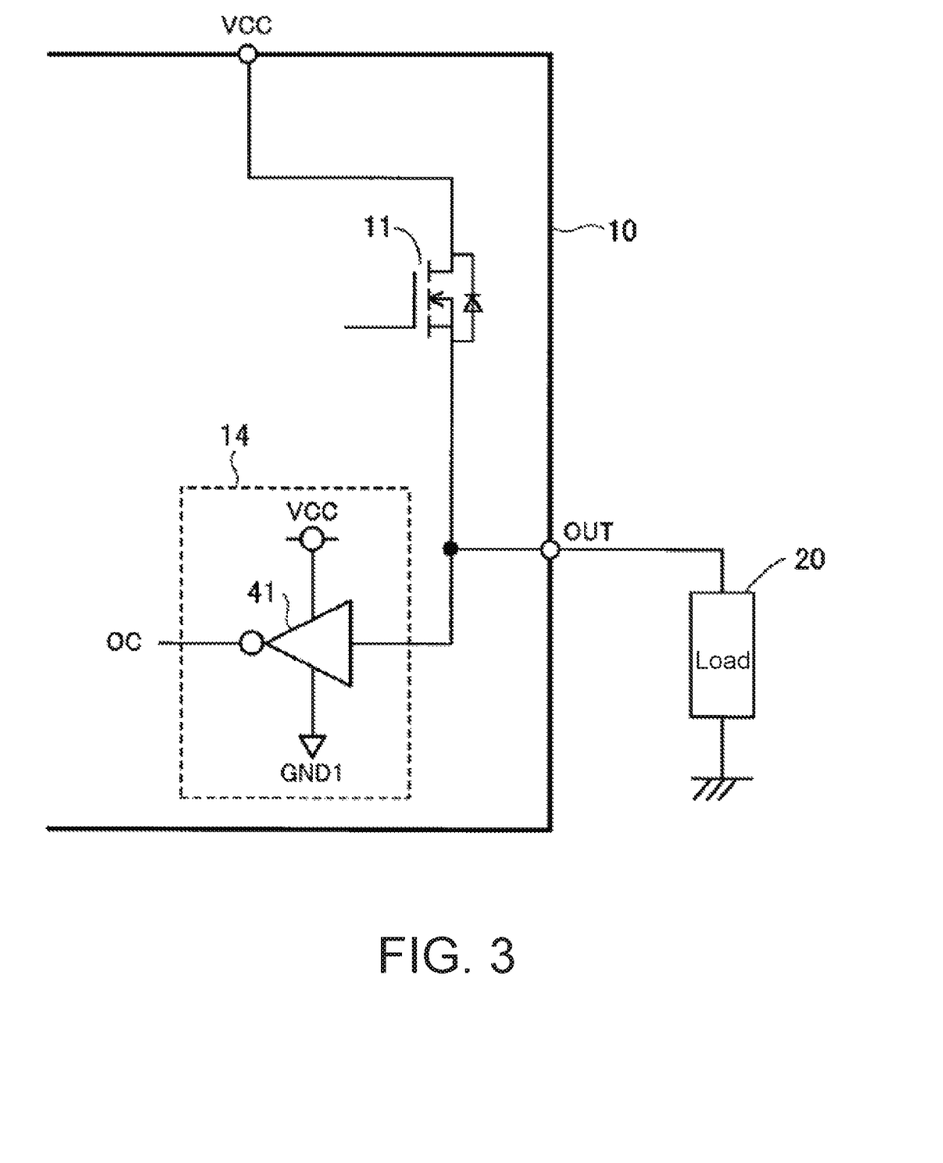
FIG. 3 is a circuit diagram of an example of an overcurrent detection circuit of the embodiment.
Figure 4:
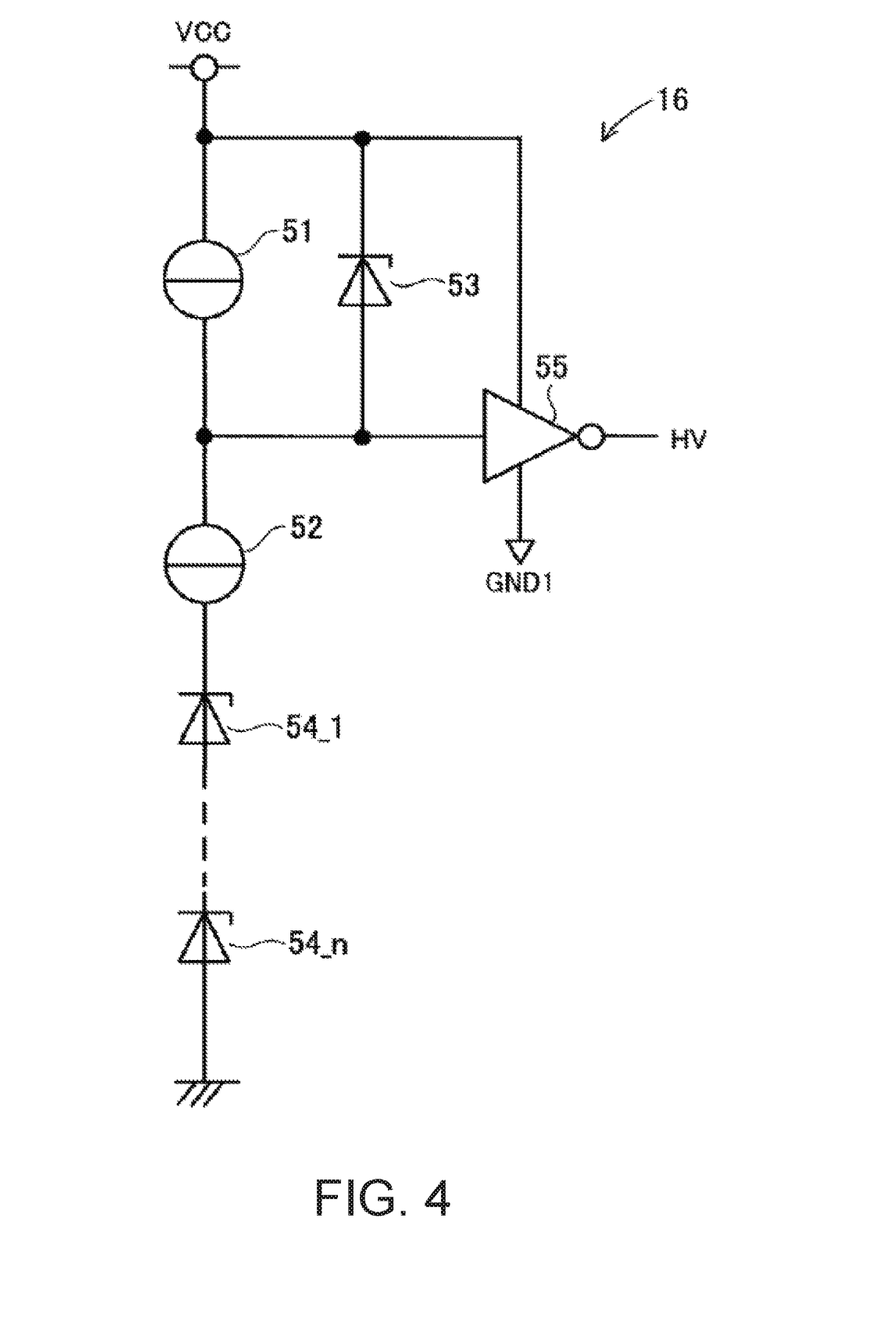
FIG. 4 is a circuit diagram of an example of a high-voltage detection circuit of the embodiment.
Figure 5:
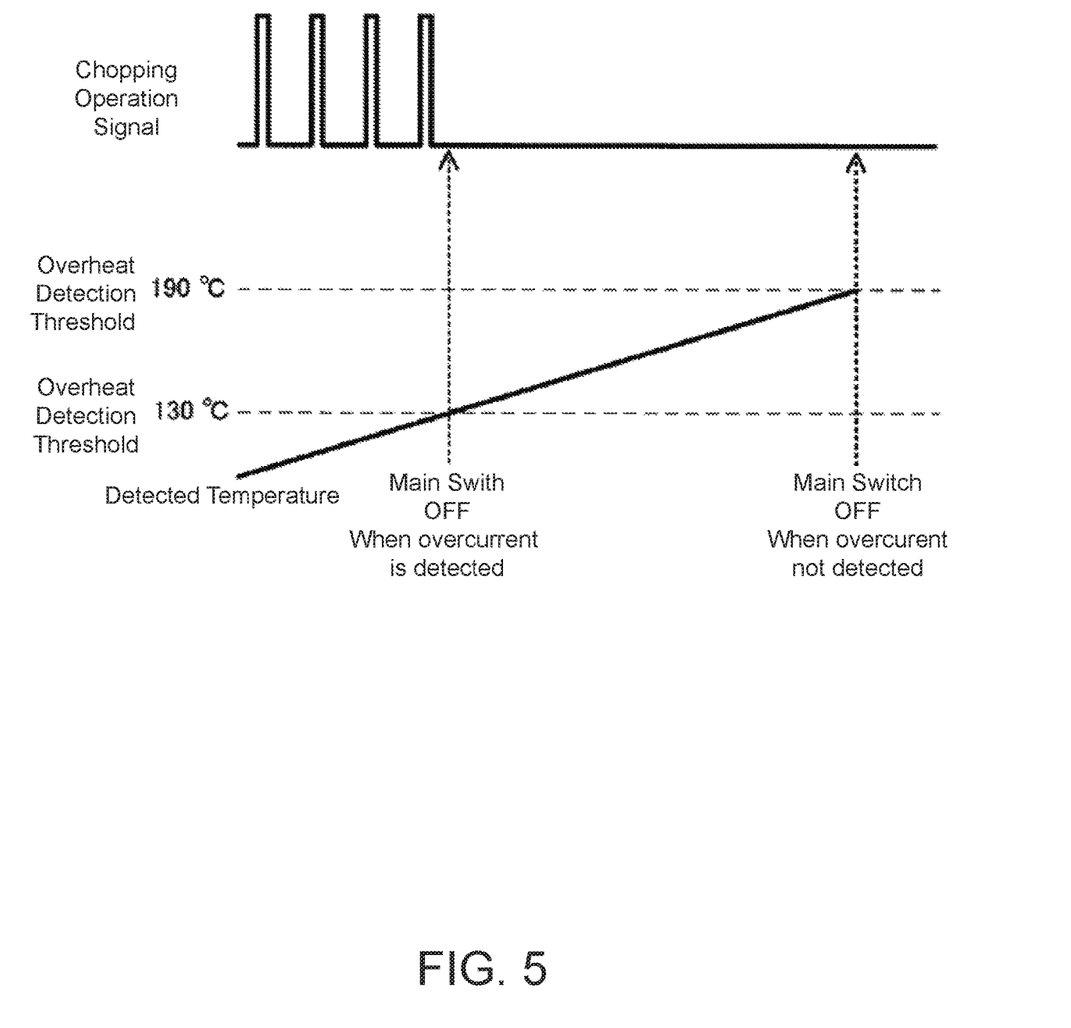
FIG. 5 explains the operation of the embodiment.

FIG. 1 shows a configuration of a high-side IPS according to an embodiment of the present invention. FIG. 2 is a circuit diagram of an example of an overheat detection circuit of the embodiment. FIG. 3 is a circuit diagram of an example of an overcurrent detection circuit of the embodiment. FIG. 4 is a circuit diagram of an example of a high-voltage detection circuit of the embodiment. FIG. 5 explains the operation of the embodiment.

As shown in FIG. 1. the high-side IPS 10 includes a main MOSFET 11 as a power semiconductor switch, a logic circuit 12, and a driver circuit 13. The high-side IPS 10 further includes an overcurrent detection circuit 14, an overheat detection circuit 15, and a high-voltage detection circuit 16, as the protection circuits. The high-side IPS further has an IN terminal, a VCC terminal, an OUT terminal, and a GND terminal.

The IN terminal of the high-side IPS 10 is connected to, for example, the output terminal of an electronic control unit (ECU) of an automobile, which is a computer. The VCC terminal of the high-side IPS 10 is connected to a battery of the automobile. The OUT terminal of the high-side IPS 10 is connected to a load 20, which is an electric component mounted on the automobile. The GND terminal is connected to a chassis of the automobile, for example.

Inside the high-side IPS 10, the IN terminal is connected to an input terminal of the logic circuit 12, an output terminal of the logic circuit 12 is connected to an input terminal of the driver circuit 13, and an output terminal of the driver circuit 13 is connected to a gate terminal of the main MOSFET 11. A drain terminal of the main MOSFET 11 is connected to the VCC terminal, and a source terminal of the main MOSFET 11 is connected to the OUT terminal.

The OUT terminal is connected to the overcurrent detection circuit 14, and an output terminal of the overcurrent detection circuit 14 is connected to a terminal of the logic circuit 12 that receive an overcurrent detection signal OC and to a terminal of the overheat detection circuit 15 that receives the overcurrent detection signal OC. An output terminal of the overheat detection circuit 15 is connected to a terminal of the logic circuit 12 that receive an overheat detection signal OH. The high-voltage detection circuit 16 is connected to the VCC terminal and to the GND terminal, and an output terminal of the high-voltage detection circuit 16 is connected to a terminal of the overheat detection circuit 15 that receives a high-voltage detection signal HV.

As shown in FIG. 2, the overheat detection circuit 15 includes a constant current circuit 31, diodes 32, 33, 34, and 35, a Schmitt-trigger inverter circuit 36, an N-channel MOSFET (switching device) 37, and an OR gate 38. One of the terminals of the constant current circuit 31 is connected a line having the VCC voltage, and the other terminal thereof is connected to the anode terminal of the diode 32 and to the input terminal of the Schmitt-trigger inverter circuit 36. An output terminal of the Schmitt-trigger inverter circuit 36 constitutes the output terminal of this overheat detection circuit 15, and outputs the overheat detection signal OH to the logic circuit 12.

The diodes 32, 33, 34, and 35 are connected in series and together constitute a temperature sensor. The cathode terminal of the diode 35 is connected to an internal ground GND1, which is a low-voltage side reference voltage when the overheat detection circuit 15 operates using the VCC voltage as a reference voltage. The internal ground GND1 assumes a voltage level of (VCC−5 V) when the operational voltage of the overheat detection circuit 15 is 5V, for example. The anode terminal of the diode 35, which is placed on the lowest voltage side among the diodes 32, 33, 34, and 35, is connected to the drain terminal of the MOSFET 37, and the cathode terminal thereof is connected to the source terminal of the MOSFET 37. The gate terminal of MOSFET 37 is connected to the output terminal of the OR gate 38, one of the input terminals of the OR gate 38 is connected to the output terminal of the overcurrent detection circuit 14 and the other of the input terminals of the OR gate 38 is connected to the output terminal of the high-voltage detection circuit 16.

In the overheat detection circuit 15, because the constant current circuit 31 causes the constant current It to flow through the diodes 32, 33, 34, and 35, voltage Vtp, which is a sum of the respective forward voltage drops of the diodes 32, 33, 34, and 35, appears at the connection node connecting the constant current circuit 31 and the diode 32. This voltage Vtp will be lowered as the temperature being detected goes up because the forward voltage drops of the diodes 32, 33, 34, and 35 each have a negative temperature coefficient of 2 mV/° C., for example. The changes in the voltage Vtp are detected by the Schmitt-trigger inverter circuit 36.

That is, for example, when the object of the temperature detection is 25° C., the voltage Vtp is higher than a first threshold that is set for rising input of the Schmitt-trigger inverter circuit 36, and therefore the Schmitt-trigger inverter circuit 36 outputs the L-level signal (=VCC−5V). When the temperature of the object of the temperature detection rises, causing the voltage Vtp to drop lower than a second threshold that is set for decreasing input and is lower than the first threshold, the Schmittt-trigger inverter circuit 36 outputs the H-level signal (=VCC), which is the overheat detection signal OH. For example, the temperature of the object of the temperature measurement at which the Schmitt-trigger inverter circuit 36 outputs the H-level overheat detection signal OH may be set to 190° C.

When the OR gate 38 receives the H-level overcurrent detection signal OC or the H-level high-voltage detection signal HV, the OR gate generates and outputs the H-level signal to turn on the MOSFET 37. When this occurs, the diode 35 is short-circuited by the MOSFET 37, and as a result, the temperatures sensor is now effectively composed of the diodes 32, 33, and 34 only. In this case, the voltage Vtp that is given to the Schmitt-trigger inverter circuit 36 is lowered by the amount of the forward voltage of the diode 35. Because of this, the timing at which the voltage Vtp becomes lower than the second threshold due to a rise in temperature will occur earlier than when the temperature sensor is composed of the diodes 32, 33, 34, and 35. Here, the temperature of the object of the temperature measurement at which the Schmitt-trigger inverter circuit 36 outputs the H-level overheat detection signal OH when the diode 35 is short-circuited may be set to 130° C.

As shown in FIG. 3, the overcurrent detection circuit 14 has an inverter (i.e., a NOT gate) circuit 41. An input terminal of the inverter circuit 41 is connected to a node that connects the source terminal of the main MOSFET 11 and the OUT terminal, and an output terminal of the inverter circuit 41 is connected to a terminal of the logic circuit 12 that receives the overcurrent detection signal OC and to a terminal of the overheat detection circuit 15 that receives the overcurrent detection signal OC. Here, the inverter circuit 41 operates using a voltage differential between the voltage VCC of the VCC terminal and the voltage (VCC−5V) of the internal ground GND1.

The overcurrent detection circuit 14 determines whether the main MOSFET 11 is in the overcurrent state by having the inverter circuit 41 monitor changes in voltage at the OUT terminal when the main MOSFET 11 is controlled to be ON.

That is, with the load 20 in its normal state, when the MOSFET 11 is controlled to be ON, a current that corresponds to an impedance of the load 20 flows in the main MOSFET 11. For example, if the ON resistance of the main MOSFET 11 is 50 m Ω and the load current is 1 A, the voltage Vout at the OUT terminal becomes a value that is obtained by subtracting a voltage drop due to the ON resistance of the main MOSFET 11 from the voltage VCC, as follows.

$$V\text{out}=VCC-1A\times 50m\Omega=VCC-50 \text{ mV}$$

On the other hand, if the load is short-circuited, when the main MOSFET 11 is controlled to be ON, a short-circuit current flows in the main MOSFET 11. Suppose that this short-circuit current is 3 A. The voltage Vout of the OUT terminal then becomes as follows:

$$V\text{out}=VCC-3A\times 50m\Omega=VCC-150 \text{ mV}$$

Suppose further that the output inversion threshold of the inverter circuit 41 is a value between (VCC−50 mV) and (VCC−150 mV). Then, the inverter circuit 41 outputs the L-level in the normal situation and outputs the H-level overcurrent detection signal OC when the load is short-circuited. That is, when the voltage Vout at the OUT terminal decreases from (VCC−50 mV) to (VCC−150 mV), the inverter circuit 41 determines that an overcurrent is detected and outputs the H-level overcurrent detection signal OC.

As shown in FIG. 4, the high-voltage detection circuit 16 includes constant current circuits 51 and 52, Zener diodes 53 and 54_1 to 54_n, and an inverter (a NOT gate) circuit 55. The constant current circuits 51 and 52 and the n units of Zener diodes 54_1 to 54_n are mutually connected in series between the VCC terminal and the GND terminal, and the Zener diode 53 is connected in parallel with the constant current circuit 51. Specifically, one of the terminals of the constant current circuit 51 and the cathode terminal of the Zener diode 53 are both connected to a line connected to the voltage VCC, and the other terminal of the constant current terminal 51 and the anode terminal of the Zener diode 53 are both connected to one of the terminals of the constant current circuit 52. The other terminal of the constant current circuit 52 is connected to the cathode terminal of the Zener diode 54_1 that is placed at the highest voltage position in the series of the Zener diodes 54_1 to 54_n that are connected in series. The anode terminal of the Zener diode 54_n that is placed at the lowest voltage position in the series of the Zener diodes 54_1 to 54_n is connected to the GND terminal.

A node connecting the constant current circuit 51 and the constant current circuit 52 and the anode terminal of the Zener diode 53 are connected to the input terminal of the inverter circuit 55. The output terminal of the inverter circuit 55 constitutes the output terminal of this high-voltage detection circuit 16 and sends out the high-voltage detection signal HV to the overheat detection circuit 15.

In the high-voltage detection circuit 16, the Zener voltage of the Zener diode 53 is set to 5V, for example, and a total sum of the Zener voltages of the serially connected Zener diodes 54_1 to 54_n is set to 20V, for example. Further, the constant current value of the constant current circuit 51 is set to be smaller than the constant current value of the constant current circuit 52.

In the high-voltage detection circuit 16, when the voltage VCC of the VCC terminal is 13V, which is the normal voltage, almost no current flows through the Zener diode 54_1 to 54_n, and therefore, the input terminal of the inverter circuit 55 is in the H level (=VCC). As a result, the inverter circuit 55 outputs the L-level signal (=VCC−5V) at the output terminal of the inverter circuit 55.

If the voltage VCC of the VCC terminal exceeds 25V, a current starts to flow in the Zener diodes 53 and 54_1 to 54_n, the voltage at the input terminal of the inverter circuit 55 becomes the L-level (=VCC−5V). As a result, the inverter circuit 55 outputs the H-level high-voltage detection signal HV (=VCC) at the output terminal. The voltage VCC of the VCC terminal exceeds 25V when the automobile is jump-started, for example. This way, the high-voltage detection circuit 16 can detect a high-voltage condition of the VCC voltage at the VCC terminal, which is still within the normal range, but is higher than the regular situation (say, 13V).

According to the high-side IPS 10 described above, when the overcurrent detection circuit 14 and the overheat detection circuit 15 do not detect any abnormalities, the main MOSFET 11 is controlled to be ON or OFF in accordance with the signal inputted in the IN terminal. When either of the overcurrent detection circuit 14 or the overheat detection circuit 15 is detecting an abnormality, the logic circuit 12 performs a corresponding protection operation. Specifically, when the overcurrent detection circuit 14 detects an overcurrent, the logic circuit 12 generates and outputs a chopping operation signal so that the main MOSFET 11 is operated in a chopping manner. When the overheat detection circuit 15 detects that the temperature of the high-side IPS 10 has increased to 190° C., the logic circuit outputs a signal that turns off the main MOSFET 11 so as to terminate the ON-OFF control of the main MOSFET 11.

Here, when the overcurrent detection circuit 14 detects an overcurrent, the overcurrent detection signal OC is sent to the overheat detection circuit 15 also, and when the high-voltage detection circuit 16 detects a high voltage, the high-voltage detection signal HV is sent to the overheat detection circuit 15. When the overheat detection circuits receives the overcurrent detection signal OC or the high-voltage detection signal HV (or both), the overheat detection circuit 15 lowers the overheat detection threshold to 130° C. from 190° C.

Thus, as shown in FIG. 5, when the overcurrent detection circuit 14 detects an overcurrent and outputs the overcurrent detection signal OC, the logic circuit 12 outputs the chopping operation signal, thereby causing the main MOSFET 11 to operate in a chopping manner. The temperature of the mina MOSFET 11 will increase due to the chopping operation, and when the temperature rises due to the overcurrent, the overheat detection circuit 15 performs the overheat detection at the 130° C. Once the overheat is detected, the logic circuit 12 terminates the chopping operation of the main NOSFET 11. This can surely prevent serious damages on the main MOSFET 11 such as a burnout.

Similarly, when the high-voltage detection circuit 16 detects a high voltage at the VCC, if the temperature rises due to the high-voltage condition, the overheat detection circuit 15 performs the overheat detection at the 130° C. Once the overheat is detected, the logic circuit 12 terminates the operation of the main NOSFET 11.

As described above, in this high-side IPS 10, once the overcurrent detection circuit 14 detects an overcurrent or the high-voltage detection circuit 16 detects a high voltage, the overheat detection circuit 15 sets the overheat detection threshold to 130° C. Therefore, the rise in temperature due to the overcurrent or high-voltage would occur only up to 130° C., thereby significantly reducing the stress that would be applied to the main NOSFET 11 if the temperature had allowed to increase up to 190° C.

In the embodiment described above, the overheat detection circuit 15 changes the overheat detection threshold in response to the overcurrent detection signal OC and/or the high-voltage detection signal HV. The present invention is not limited to this. For example, the overheat detection circuit 15 may be configured to change the overheat detection threshold in response to only one of the overcurrent detection signal OC and the high-voltage detection signal HV. Further, the low temperature threshold of 130° C. and the high temperature threshold of 190° C. are merely examples, and other temperatures may also be suitable and possible, depending on the needs and specifications.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device having an input terminal to receive an input signal, an output terminal to be connected to a load, and a power supply terminal to receive a power supply voltage, the semiconductor device comprising:
   a power semiconductor switch connected between the power supply terminal and the output terminal;
   a logic circuit connected to the input terminal, the logic circuit generating a logic output signal in accordance with the input signal inputted to the input terminal, the logic output signal causing the power semiconductor switch to turn ON or OFF;
   an overheat detection circuit that outputs to the logic circuit an overheat detection signal when a temperature of the power semiconductor switch exceeds an overheat detection threshold; and
   an overcurrent detection circuit that monitors a current that flows through the power semiconductor switch and that outputs to the logic circuit and to the overheat detection circuit an overcurrent detection signal when the current that flows through the power semiconductor switch exceeds a prescribed threshold,
   wherein in the overheat detection circuit, the overheat detection threshold is set to a first threshold value when semiconductor device is operating normally, and the overheat detection threshold values is changed to a second threshold value that is lower than the first threshold value when the overheat detection circuit receives the overcurrent detection signal from the overcurrent detection circuit, and
   wherein the overcurrent protection circuit includes an inverter circuit that monitors a voltage at the output terminal and that outputs the overcurrent detection signal when a voltage drop due to an ON resistance of the power semiconductor switch becomes lower than an output inversion threshold of the inverter circuit.

2. The semiconductor device according to claim 1, wherein when the logic circuit receives the overcurrent detection signal, the logic circuit generates and outputs a chopping signal, as the logic output signal, that causes the power semiconductor switch to operate in a chopping mode.

3. A semiconductor device having an input terminal to receive an input signal, an output terminal to be connected to a load, and a power supply terminal to receive a power supply voltage, the semiconductor device comprising:
   a power semiconductor switch connected between the power supply terminal and the output terminal;
   a logic circuit connected to the input terminal, the logic circuit generating a logic output signal in accordance with the input signal inputted to the input terminal, the logic output signal causing the power semiconductor switch to turn ON or OFF;
   an overheat detection circuit that outputs to the logic circuit an overheat detection signal when a temperature of the power semiconductor switch exceeds an overheat detection threshold;
   an overcurrent detection circuit that monitors a current that flows through the power semiconductor switch and that outputs to the logic circuit and to the overheat detection circuit an overcurrent detection signal when the current that flows through the power semiconductor switch exceeds a prescribed threshold; and
   a high-voltage detection circuit that monitors the power supply voltage on the power supply terminal and outputs to the overheat detection circuit a high-voltage detection signal when the power supply voltage exceeds a prescribed voltage,
   wherein in the overheat detection circuit, the overheat detection threshold is set to a first threshold value when semiconductor device is operating normally, and the overheat detection threshold values is changed to a second threshold value that is lower than the first threshold value when the overheat detection circuit receives the overcurrent detection signal from the overcurrent detection circuit, and
   wherein when the overheat detection circuit receives the high-voltage detection signal from the high-voltage detection circuit, the overheat detection threshold values is also changed from the first threshold value to the second threshold value.

4. The semiconductor device according to claim 3, wherein the overheat detection circuit includes a temperature detection sensor comprising a plurality of diodes mutually connected in series, and a switching device that short-circuits one or more of the plurality of diodes in response to the overcurrent detection signal, and
   wherein the switching device of the overheat detection circuit also short-circuits said one or more of the plurality of diodes in response to the high-voltage detection signal.

5. The semiconductor device according to claim 4, wherein the overheat detection circuit comprises:
   a temperature detection sensor comprising a plurality of diodes mutually connected in series;
   an OR gate configured to receive the overcurrent detection signal and the high-voltage detection signal; and
   a switching device connected to an output of the OR gate, the switching device short-circuiting one or more of the plurality of diodes when the output of the OR gate is HIGH.

6. A semiconductor device having an input terminal to receive an input signal, an output terminal to be connected to a load, and a power supply terminal to receive a power supply voltage, the semiconductor device comprising:
   a power semiconductor switch connected between the power supply terminal and the output terminal;
   a logic circuit connected to the input terminal, the logic circuit generating a logic output signal in accordance with the input signal inputted to the input terminal, the logic output signal causing the power semiconductor switch to turn ON or OFF;
an overheat detection circuit that outputs to the logic circuit an overheat detection signal when a temperature of the power semiconductor switch exceeds an overheat detection threshold;
an overcurrent detection circuit that monitors a current that flows through the power semiconductor switch and that outputs to the logic circuit and to the overheat detection circuit an overcurrent detection signal when the current that flows through the power semiconductor switch exceeds a prescribed threshold; and
a high-voltage detection circuit that monitors the power supply voltage on the power supply terminal and outputs to the overheat detection circuit a high-voltage detection signal when the power supply voltage exceeds a prescribed voltage,
wherein in the overheat detection circuit, the overheat detection threshold is set to a first threshold value when semiconductor device is operating normally, and the overheat detection threshold values is changed to a second threshold value that is lower than the first threshold value when the overheat detection circuit receives the overcurrent detection signal from the overcurrent detection circuit,
wherein the overcurrent protection circuit includes an inverter circuit that monitors a voltage at the output terminal and that outputs the overcurrent detection signal when a voltage drop due to an ON resistance of the power semiconductor switch becomes lower than an output inversion threshold of the inverter circuit,
wherein the high-voltage detection circuit comprises:
a first constant current circuit, a second constant current circuit, and a plurality of Zener diodes, all of which are connected in series between the power supply terminal and a ground terminal;
a Zener diode for logic signal generation, connected in parallel to the first constant current circuit, the Zener diode for logic signal generation generating a logic signal with reference to the power supply voltage at the power supply voltage terminal; and
an inverter circuit that receives a voltage at a node connecting the first constant current circuit and the second constant current source and that outputs the high-voltage detection signal when the power supply voltage applied to the power supply voltage terminal exceeds a sum of respective Zener voltages of the plurality of Zener diodes and the Zener diode for logic signal generation, and
wherein the overheat detection circuit comprises:
a temperature detection sensor comprising a plurality of diodes mutually connected in series;
an OR gate configured to receive the overcurrent detection signal and the high-voltage detection signal; and
a switching device connected to an output of the OR gate, the switching device short-circuiting one or more of the plurality of diodes when the output of the OR gate is HIGH.

7. A semiconductor device having an input terminal to receive an input signal, an output terminal to be connected to a load, and a power supply terminal to receive a power supply voltage, the semiconductor device comprising:
a power semiconductor switch connected between the power supply terminal and the output terminal;
a logic circuit connected to the input terminal, the logic circuit generating a logic output signal in accordance with the input signal inputted to the input terminal, the logic output signal causing the power semiconductor switch to turn ON or OFF;
an overheat detection circuit that outputs to the logic circuit an overheat detection signal when a temperature of the power semiconductor switch exceeds an overheat detection threshold; and
a high-voltage detection circuit that monitors the power supply voltage on the power supply terminal and outputs to the overheat detection circuit a high-voltage detection signal when the power supply voltage exceeds a prescribed voltage,
wherein in the overheat detection circuit, the overheat detection threshold is set to a first threshold value when semiconductor device is operating normally, and the overheat detection threshold values is changed to a second threshold value that is lower than the first threshold value when the overheat detection circuit receives the high-voltage detection signal from the high-voltage detection circuit.

8. The semiconductor device according to claim 7, wherein the overheat detection circuit includes a temperature detection sensor comprising a plurality of diodes mutually connected in series, and a switching device that short-circuits one or more of the plurality of diodes in response to the high-voltage detection signal.

9. The semiconductor device according to claim 7, wherein the high-voltage detection circuit comprises:
a first constant current circuit, a second constant current circuit, and a plurality of Zener diodes, all of which are connected in series between the power supply terminal and a ground terminal;
a Zener diode for logic signal generation, connected in parallel to the first constant current circuit, the Zener diode for logic signal generation generating a logic signal with reference to the power supply voltage at the power supply voltage terminal; and
an inverter circuit that receives a voltage at a node connecting the first constant current circuit and the second constant current source and that outputs the high-voltage detection signal when the power supply voltage applied to the power supply voltage terminal exceeds a sum of respective Zener voltages of the plurality of Zener diodes and the Zener diode for logic signal generation.

10. The semiconductor device according to claim 1, wherein the overheat detection circuit includes a temperature detection sensor comprising a plurality of diodes mutually connected in series, and a switching device that short-circuits one or more of the plurality of diodes in response to the overcurrent detection signal.

11. The semiconductor device according to claim 1, further comprising:
a high-voltage detection circuit that monitors the power supply voltage on the power supply terminal and outputs to the overheat detection circuit a high-voltage detection signal when the power supply voltage exceeds a prescribed voltage,
wherein when the overheat detection circuit receives the high-voltage detection signal from the high-voltage detection circuit, the overheat detection threshold values is also changed from the first threshold value to the second threshold value.

12. The semiconductor device according to claim 11, wherein the overheat detection circuit comprises:
a temperature detection sensor comprising a plurality of diodes mutually connected in series;

an OR gate configured to receive the overcurrent detection signal and the high-voltage detection signal; and
a switching device connected to an output of the OR gate, the switching device short-circuiting one or more of the plurality of diodes when the output of the OR gate is HIGH.

13. The semiconductor device according to claim 10, further comprising:
a high-voltage detection circuit that monitors the power supply voltage on the power supply terminal and outputs to the overheat detection circuit a high-voltage detection signal when the power supply voltage exceeds a prescribed voltage,
wherein the switching device of the overheat detection circuit also short-circuits said one or more of the plurality of diodes in response to the high-voltage detection signal.

14. The semiconductor device according to claim 1, further comprising:
a high-voltage detection circuit that monitors the power supply voltage on the power supply terminal and outputs to the overheat detection circuit a high-voltage detection signal when the power supply voltage exceeds a prescribed voltage,
wherein the overcurrent protection circuit includes an inverter circuit that monitors a voltage at the output terminal and that outputs the overcurrent detection signal when a voltage drop due to an ON resistance of the power semiconductor switch becomes lower than an output inversion threshold of the inverter circuit,
wherein the high-voltage detection circuit comprises:
a first constant current circuit, a second constant current circuit, and a plurality of Zener diodes, all of which are connected in series between the power supply terminal and a ground terminal;
a Zener diode for logic signal generation, connected in parallel to the first constant current circuit, the Zener diode for logic signal generation generating a logic signal with reference to the power supply voltage at the power supply voltage terminal; and
an inverter circuit that receives a voltage at a node connecting the first constant current circuit and the second constant current source and that outputs the high-voltage detection signal when the power supply voltage applied to the power supply voltage terminal exceeds a sum of respective Zener voltages of the plurality of Zener diodes and the Zener diode for logic signal generation, and
wherein the overheat detection circuit comprises:
a temperature detection sensor comprising a plurality of diodes mutually connected in series;
an OR gate configured to receive the overcurrent detection signal and the high-voltage detection signal; and
a switching device connected to an output of the OR gate, the switching device short-circuiting one or more of the plurality of diodes when the output of the OR gate is HIGH.

* * * * *

UNITED STATES PATENT AND TRADEMARK OFFICE
CERTIFICATE OF CORRECTION

| | |
|---|---|
| PATENT NO. | : 11,329,474 B2 |
| APPLICATION NO. | : 16/864438 |
| DATED | : May 10, 2022 |
| INVENTOR(S) | : Sho Nakagawa and Morio Iwamizu |

It is certified that error appears in the above-identified patent and that said Letters Patent is hereby corrected as shown below:

In the Claims

Column 10, Line 49 in Claim 5, the text "according to claim 4" should be changed to -- according to claim 3 --.

Signed and Sealed this
Thirtieth Day of August, 2022

Katherine Kelly Vidal
*Director of the United States Patent and Trademark Office*